(12) United States Patent
Wu et al.

(10) Patent No.: US 7,566,598 B2
(45) Date of Patent: Jul. 28, 2009

(54) METHOD OF MASK REDUCTION FOR PRODUCING A LTPS-TFT ARRAY BY USE OF PHOTO-SENSITIVE LOW-K DIELECTRICS

(75) Inventors: Yung Fu Wu, Jhonghe (TW); Chin Chiang Chen, Luodong Township, Yilan County (TW); Chen Ming Chen, Taichung (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 10/984,792

(22) Filed: Nov. 10, 2004

(65) Prior Publication Data

US 2006/0099746 A1    May 11, 2006

(30) Foreign Application Priority Data

Aug. 10, 2004    (TW) .............................. 93124138 A

(51) Int. Cl.
*H01L 21/00*    (2006.01)
(52) U.S. Cl. ...................... 438/151; 438/164; 438/725; 438/780; 257/E21.411
(58) Field of Classification Search ................ 438/151, 438/479, 585, 586, 725, 780; 257/E21.094, 257/E21.104, E21.411
See application file for complete search history.

(56) References Cited

U.S. PATENT DOCUMENTS

| | | | |
|---|---|---|---|
| 6,348,367 B1 * | 2/2002 | Ohtani et al. ............... | 438/151 |
| 6,445,059 B1 * | 9/2002 | Yamazaki .................... | 257/642 |
| 6,465,284 B1 * | 10/2002 | Adachi et al. ............... | 438/151 |
| 6,528,824 B2 * | 3/2003 | Yamagata et al. ............. | 257/81 |
| 6,534,832 B2 * | 3/2003 | Takemura .................... | 257/350 |
| 6,597,415 B2 * | 7/2003 | Rho et al. .................... | 349/42 |
| 6,642,091 B1 * | 11/2003 | Tanabe ........................ | 438/166 |
| 6,806,036 B2 * | 10/2004 | You .......................... | 430/314 |
| 7,022,556 B1 * | 4/2006 | Adachi ........................ | 438/149 |
| 7,037,765 B2 * | 5/2006 | Yamazaki et al. ........... | 438/149 |
| 7,049,184 B2 * | 5/2006 | Tanabe ........................ | 438/166 |
| 7,052,944 B2 * | 5/2006 | Tanabe ........................ | 438/166 |
| 7,063,999 B2 * | 6/2006 | Tanabe et al. ................ | 438/62 |
| 7,064,735 B2 * | 6/2006 | Murade ....................... | 345/87 |
| 2004/0207800 A1 * | 10/2004 | Hiruma et al. .............. | 349/189 |
| 2005/0087769 A1 * | 4/2005 | Yamazaki et al. ........... | 257/202 |

* cited by examiner

*Primary Examiner*—Charles D. Garber
*Assistant Examiner*—Stanetta D Isaac
(74) *Attorney, Agent, or Firm*—WPAT., P.C.; Justin King

(57) ABSTRACT

The present invention discloses a method of mask reduction for producing a low-temperature polysilicon thin film transistor array by use of a photo-sensitive low-K dielectric, which comprises the steps of: defining a polysilicon-island on a preprocessed glass substrate; forming a gate oxide layer and a first metal layer in sequence; patterning the first metal layer to define a gate; forming a photosensitive dielectric layer; patterning the photosensitive dielectric layer and the gate oxide layer to form a plurality of contact holes, wherein said photo-sensitive low-K dielectric masks said gate oxide layer during said patterning of said gate oxide layer; forming a transmissive pixel layer and patterning the same; and forming a reflective pixel electrode layer and patterning the same.

16 Claims, 8 Drawing Sheets

METHOD OF MASK REDUCTION FOR PRODUCING A LTPS-TFT ARRAY BY USE OF PHOTO-SENSITIVE LOW-K DIELECTRICS

FIELD OF THE INVENTION

The present invention relates to a method of mask reduction of low-temperature polysilicon thin film transistor (LTPS-TFT) array by use of photo-sensitive low-K dielectric, and more particularly, to a method of mask reduction by using photo-sensitive materials to define all metal wire contact holes, which is capable of simplifying the fabrication process of LTPS-TFT.

BACKGROUND OF THE INVENTION

In the present flat panel display technology, the liquid crystal display (LCD) technology is mature and has geometric growth every year in both the number of electronic products using the same and the number sold on the current market. Nevertheless, among all the LCDs, only the color and quality of the thin film transistor LCDs is good enough to compare with those of the cathode ray tube (CRT).

Today, many different processes for fabricating thin film transistor liquid crystal display (TFT LCD) have been developed. The conventional TFT LCD fabrication process primarily uses a deposition method to deposit a plurality of TFT structure layers onto a glass substrate in sequence. To accomplish a high-precision device and pixel arrangement, polysilicon has gradually replaced the amorphous silicon and has become a focus in the development of thin film transistor technologies.

However, the procedure of fabricating polysilicon devices generally requires the use of more than 9 masks for fabricating a polysilicon thin film transistor as disclosed in the U.S. Pat. No. 6,037,195, which is far more complicated and time-consuming than the 5 masks used for fabricating a typical amorphous silicon devices.

Thus, the U.S. Pat. No. 5,913,113 disclosed a fabrication process of 5 masks in order to lower the cost of manufacturing thin film transistor arrays. Although the 5 masks fabrication process of the U.S. Pat. No. 5,913,113 can save the amount of masks required, the most difficult technical issue of the foregoing patent resides on simultaneously etching dielectric layers with different depths causing a narrow process window unfavorable to the actual mass production. In addition, as disclosed in the patent, the process window is further restricted since the wiring process is occurs prior to the laser crystallization process.

In view of the description above, the conventional fabrication process of polysilicon thin film transistor has at least the following drawbacks:

1. The process is more complicated and time consuming since more masks are required to be used in the fabrication process of a conventional polysilicon thin film transistor, such that the manufacturing cost is increased and thus the competitiveness is negatively affected.
2. The prior-art fabrication process for producing a polysilicon thin film transistor etches the dielectric layers with different depths simultaneously causing a narrow process window that is unfavorable to actual mass production.
3. In the prior-art fabrication process for producing a polysilicon thin film transistor, the process window is further restricted, thus increasing the level of complexity of the overall fabrication process since the wiring process is occurs prior to the laser crystallization process.

SUMMARY OF THE INVENTION

In view of the drawbacks of the prior art, it is the primary objective of the invention to provide a method of mask reduction for producing a low-temperature polysilicon thin film transistor array by use of a photo-sensitive low-K dielectric, which uses photo-sensitive materials to define all metal wire contact holes for reducing the number of masks required, and thus is capable of simplifying the fabrication process of LTPS-TFT so as to lower the manufacturing cost and improve competitiveness.

Another objective of the present invention is to provide a method of mask reduction of low-temperature polysilicon thin film transistor array by use of photo-sensitive low-K dielectric, so that the contact holes will not have height difference while etching the same simultaneously. Therefore, the process window is broadened and the etching condition can be controlled easily.

Yet, another objective of the present invention is to provide a method of mask reduction of low-temperature polysilicon thin film transistor array by use of photo-sensitive low-K dielectric, so that the taper angle for etching the metal wires is loosely restricted and the process does not require a metal layer disposed as the bottom layer, and therefore the method enables the crystallization process to be simplified and the process window to be broadened.

To achieve the foregoing objectives, the method of mask reduction for producing a transmissive low-temperature polysilicon thin film transistor array by use of a photo-sensitive low-K dielectric according to a preferred embodiment of the present invention comprises the steps of:

(a) defining a polysilicon-island on a preprocessed glass substrate;
(b) forming a gate oxide layer and a first metal layer in sequence;
(c) patterning the first metal layer to define a gate;
(d) forming a photosensitive dielectric layer;
(e) patterning the photosensitive dielectric layer and the gate oxide layer to form a plurality of contact holes, wherein said photo-sensitive low-K dielectric masks said gate oxide layer during said patterning of said gate oxide layer;
(f) forming and patterning a second metal layer; and
(g) forming a pixel electrode layer and patterning the pixel electrode layer to define a pixel electrode.

The method of mask reduction for producing a reflective low-temperature polysilicon thin film transistor array by use of a photo-sensitive low-K dielectric according to another preferred embodiment of the present invention comprises the steps of:

(a) defining a polysilicon-island on a preprocessed glass substrate;
(b) forming a gate oxide layer and a first metal layer in sequence;
(c) patterning the first metal layer to define a gate;
(d) forming a photosensitive dielectric layer;
(e) patterning the photosensitive dielectric layer and the gate oxide layer to form a plurality of contact holes, wherein said photo-sensitive low-K dielectric masks said gate oxide layer during said patterning of said gate oxide layer; and
(f) forming a reflective pixel electrode layer and patterning the same.

The method of transflective mask reduction for producing a low-temperature polysilicon thin film transistor array by use of a photo-sensitive low-K dielectric according to yet another preferred embodiment of the present invention comprises the steps of:

(a) defining a polysilicon-island on a preprocessed glass substrate;

(b) forming a gate oxide layer and a first metal layer in sequence;

(c) patterning the first metal layer to define a gate;

(d) forming a photosensitive dielectric layer;

(e) patterning the photosensitive dielectric layer and the gate oxide layer to form a plurality of contact holes, wherein said photo-sensitive low-K dielectric masks said gate oxide layer during said patterning of said gate oxide layer;

(f) forming a transmissive pixel electrode layer and patterning the same; and (g) forming a reflective pixel electrode layer and patterning the same.

DESCRIPTION OF THE PREFERRED EMBODIMENT

For your esteemed members of reviewing committee to further understand and recognize the fulfilled functions and structural characteristics of the invention, several preferred embodiments and a detailed description are presented as follows.

Figure 1A:
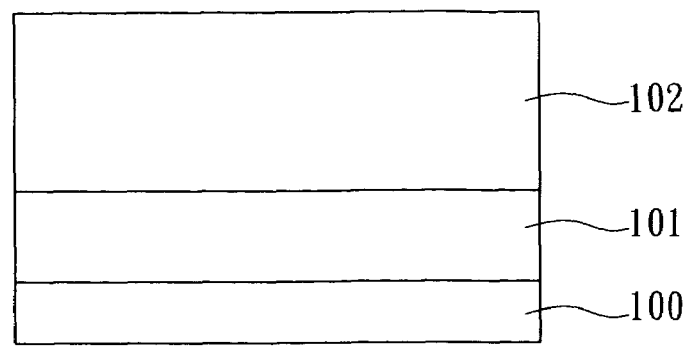
FIGS. 1A to 1C are illustrations depicting the forming of contact holes by using a photosensitive dielectric according to the present invention.
Figure 1B:
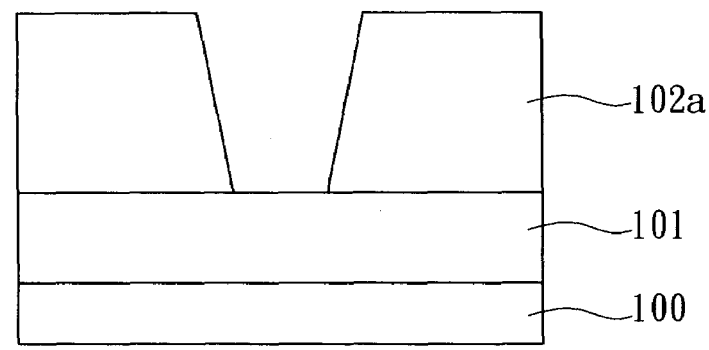
Figure 1C:
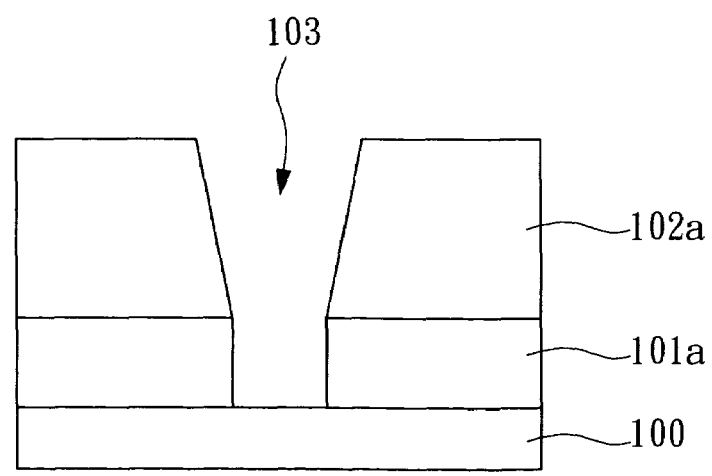

Please refer to FIGS. 1A to 1C for the illustrations depicting the forming of contact holes by using a photosensitive dielectric according to the present invention. In FIG. 1A, a three-layer structure includes a metal layer 100, an oxide layer 101 and a photosensitive dielectric layer 102. The photosensitive dielectric layer 102 is a photosensitive dielectric, which allows for the direct patterning of the dielectric by illuminating the same. Therefore, a photolithographic process can be used to transfer the lithographic patterns onto the photosensitive dielectric layer 102a. As shown in FIG. 1B, a patterned photosensitive dielectric layer 102a is completed, and thereafter, as shown in FIG. 1C, the photosensitive dielectric layer 102a is used as a mask for etching the oxide layer 101 into an oxide layer 101a with contact holes 103 so as to complete the transferring of the required pattern. Hence, the present invention only needs a mask to define the positions of all contact holes 103, such that the process of the invention can be performed with one mask less than the general fabrication process.

Please refer to FIGS. 2A to 2H for the illustrations depicting the transmissive thin film transistor fabricated by the method of mask reduction for producing a low-temperature polysilicon thin film transistor array by use of a photo-sensitive low-K dielectric according to a preferred embodiment of the present invention.

Figure 2A:
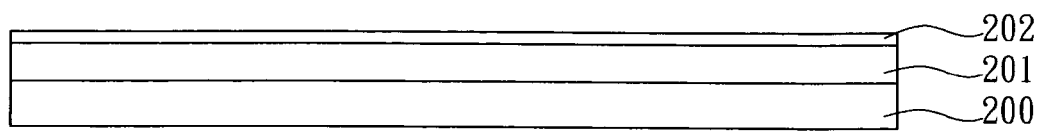
FIGS. 2A to 2H are illustrations depicting the transmissive thin film transistor fabricated by the method of mask reduction for producing a low-temperature polysilicon thin film transistor array by use of a photo-sensitive low-K dielectric according to a preferred embodiment of the present invention.
Figure 2B:
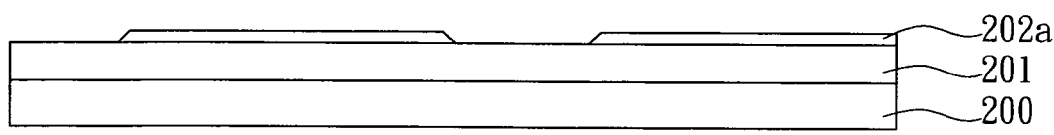

As seen in FIG. 2A, a glass substrate 200 is provided for the process of preprocessing, which includes depositing a buffer layer 201 and an active layer 202 in sequence onto the glass substrate 200, wherein the buffer layer 201 is substantially an oxide layer made of a tetraethoxysilane (TEOS) material and the active layer 202 s substantially an amorphous silicon layer ($\alpha$-Si). As seen in FIG. 2B, a polysilicon layer is formed after a high-temperature process that enables a polysilicon-island 202a to be defined by the photolithography process. The processes seen in FIG. 2B are known to the skilled artisan and thus will not be described further hereinafter.

Figure 2C:
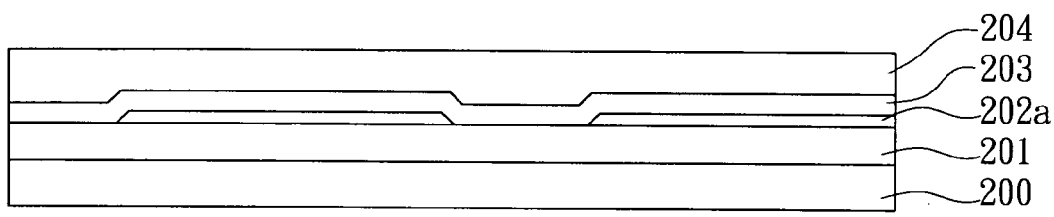

In FIG. 2C, a gate oxide layer 203 and a first metal layer 204 are formed in sequence, wherein the gate oxide layer 203 also could be an oxide layer made of a tetraethoxysilane (TEOS) material and the first metal layer 204 could be made of a common metal such as tungsten-molybdenum alloy (MoW), chromium (Cr), aluminum (Al), aluminum/neodymium (Al/Nd), molybdenum (Mo), titanium (Ti), tantalum (Ta) or copper (Cu).

Figure 2D:
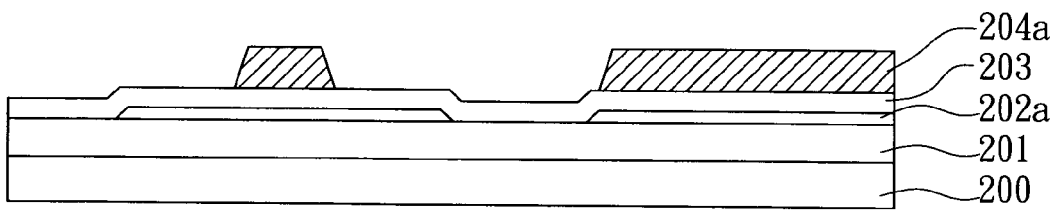

In FIG. 2D, the first metal layer 204 is patterned to define a gate 204a, and the so-called patterning refers to the photolithography processes, and so on, which are known to the persons skilled in the art, and thus will not be described hereinafter.

Figure 2E:
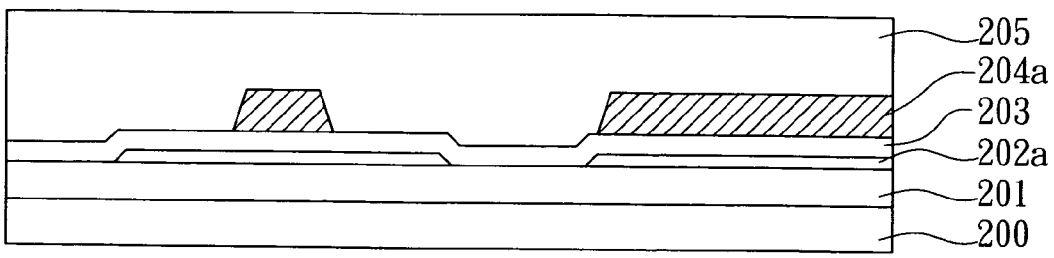
Figure 2F:
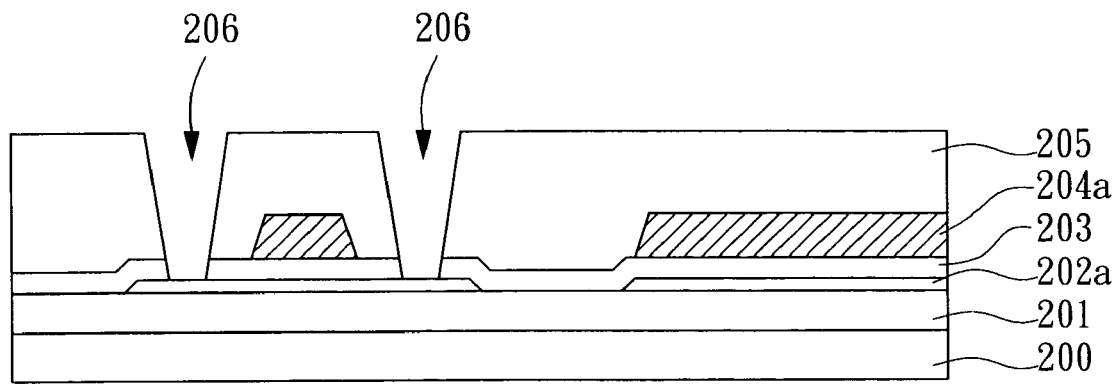

The key points of the present invention are shown in FIGS. 2E and 2F. A photosensitive dielectric layer 205 is formed, and the photolithographic process is used to transfer the lithographic pattern onto the photosensitive dielectric layer 205, and then the photosensitive dielectric layer 205 is used as a mask to carry out the etching process on the gate oxide layer 203 and form the contact hole 206 thereon. In other words, the photosensitive dielectric layer 205 and the gate oxide layer 203 are patterned to form a plurality of contact holes 206.

Figure 2G:
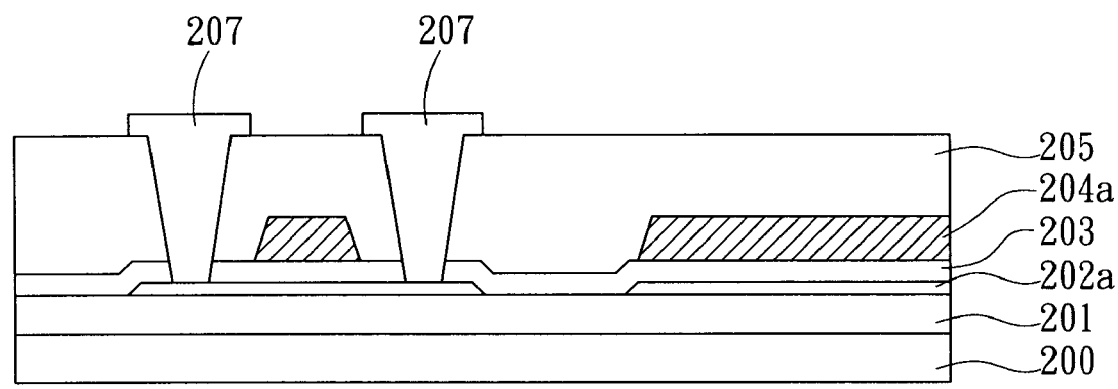

In FIG. 2G, a second metal layer 207 is formed and patterned to obtain the required layout of metal wires. The second metal layer 207 could be made of a common metal such as tungsten-molybdenum alloy (MoW), chromium (Cr), aluminum (Al), aluminum/neodymium (Al/Nd), molybdenum (Mo), titanium (Ti), tantalum (Ta) or copper (Cu).

Figure 2H:
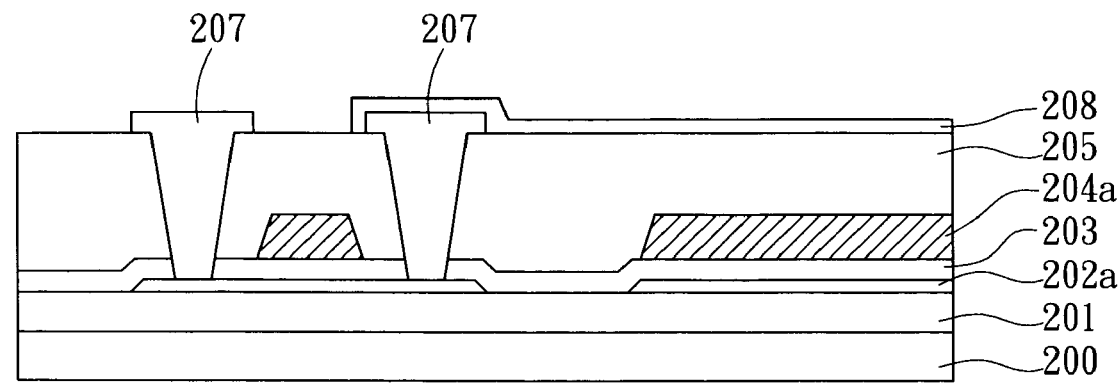

In FIG. 2H, a pixel electrode layer 208 is formed and then is patterned to define the position of a pixel electrode of the present invention.

In view of the above description, a total of 5 masks are used in the steps of: defining the polysilicon-island 202, patterning the first metal layer 204, forming the plurality of contact holes 206, patterning the second metal layer 207, and patterning the pixel electrode layer 208.

Please refer to FIGS. 3A to 3G for the illustrations depicting a reflective thin film transistor fabricated by the method of mask reduction for producing a low-temperature polysilicon thin film transistor array by use of a photo-sensitive low-K dielectric according to a preferred embodiment of the present invention.

In FIGS. 3A to 3E, the position, the materials used and the steps of the process for forming a glass substrate 300, a buffer layer 301, a polysilicon-island 302, a gate oxide layer 303, a metal layer 304, a gate 304a, a photosensitive dielectric layer 305 and a contact hole 306 are similar to those of the transmissive thin film transistor as shown in FIGS. 2A to 2F, and thus will not be described further hereinafter.

Figure 3A:
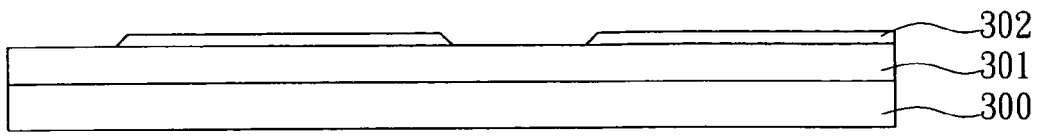
FIGS. 3A to 3G are illustrations depicting a reflective thin film transistor fabricated by the method of mask reduction for producing a low-temperature polysilicon thin film transistor array by use of a photo-sensitive low-K dielectric according to a preferred embodiment of the present invention.
Figure 3B:
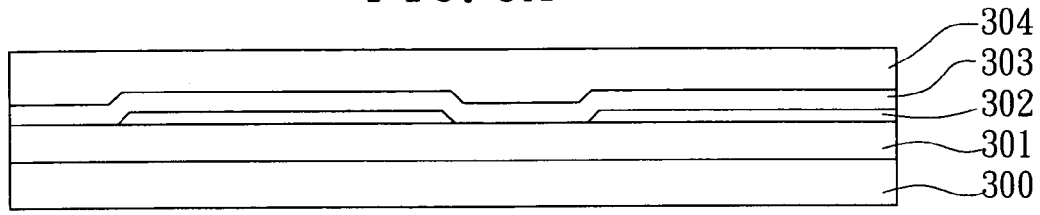
Figure 3C:
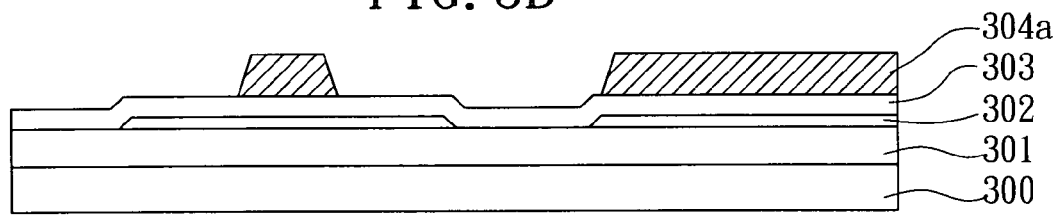
Figure 3D:
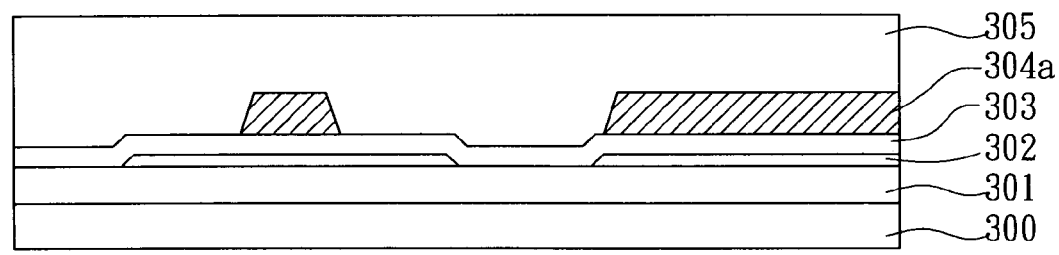
Figure 3E:
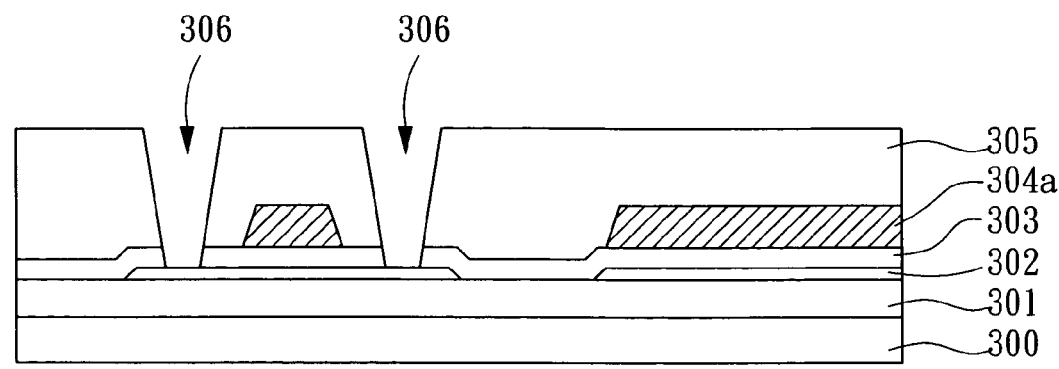
Figure 3F:
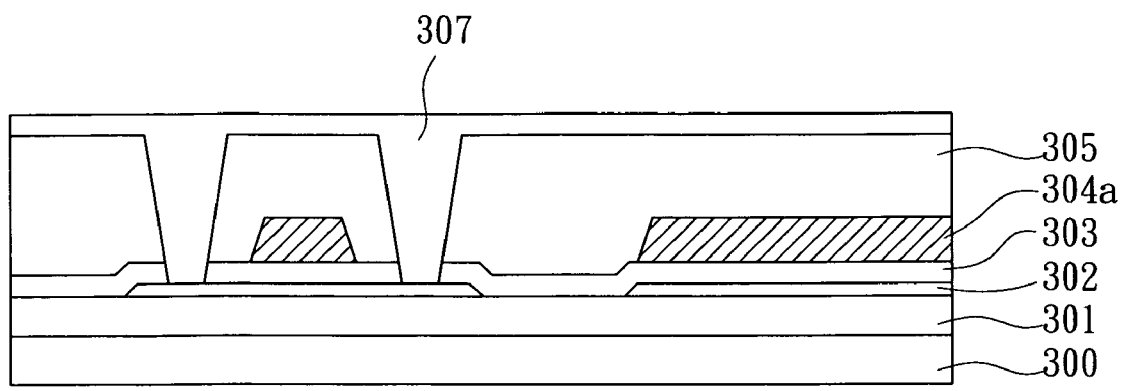
Figure 3G:
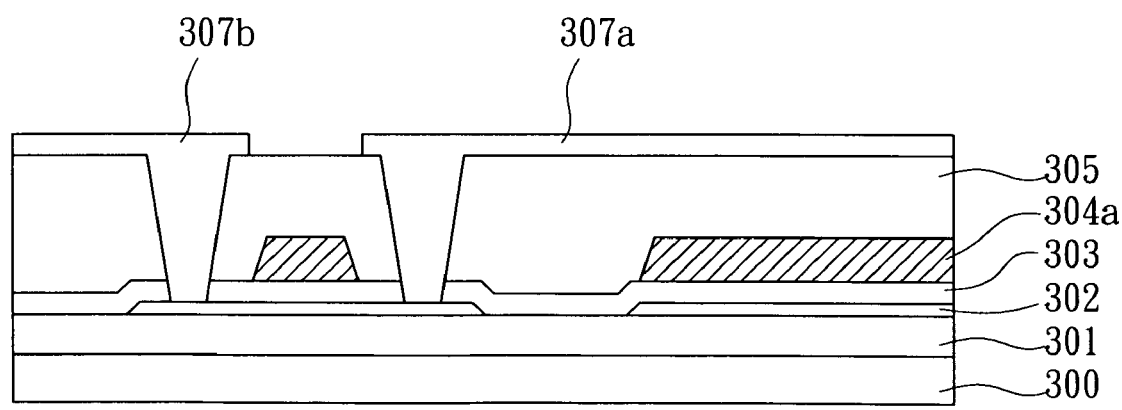

In FIGS. 3F to 3G, a second metal layer 307 is formed and patterned to define a pixel electrode 307a and a metal wiring layer 307b.

From the preferred embodiment shown in FIG. 3A to FIG. 3G, a total of 4 masks are used in the steps of: defining the polysilicon-island 302, patterning the first metal layer 304, forming the plurality of contact holes 306, and patterning the second metal layer 207.

Please refer to FIGS. 4A to 4G for the illustrations depicting a transflective thin film transistor fabricated by the method of mask reduction for producing a low-temperature polysilicon thin film transistor array by use of a photo-sensitive low-K dielectric according to a preferred embodiment of the present invention.

In FIGS. 4A to 4E, the position, the materials used and the steps of the process for forming a glass substrate 400, a buffer layer 401, a polysilicon-island 402, a gate oxide layer 403, a metal layer 404, a gate 404a, a photosensitive dielectric layer 405 and a contact hole 406 are similar to those of the transmissive thin film transistor as shown in FIGS. 2A to 2F, and thus will not be described further hereinafter.

Figure 4A:
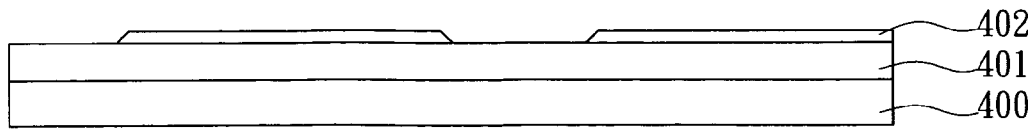
FIGS. 4A to 4G are illustrations depicting a transflective thin film transistor fabricated by the method of mask reduction for producing a low-temperature polysilicon thin film transistor array by use of a photo-sensitive low-K dielectric according to a preferred embodiment of the present invention.
Figure 4B:
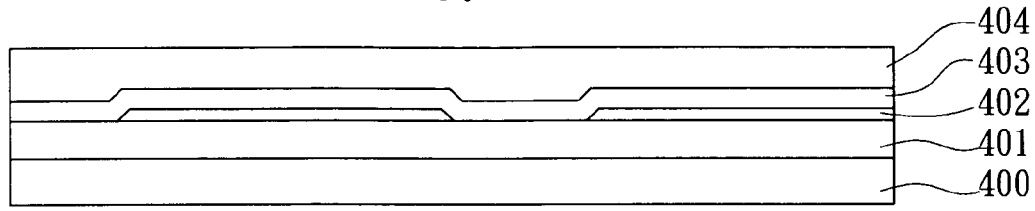
Figure 4C:
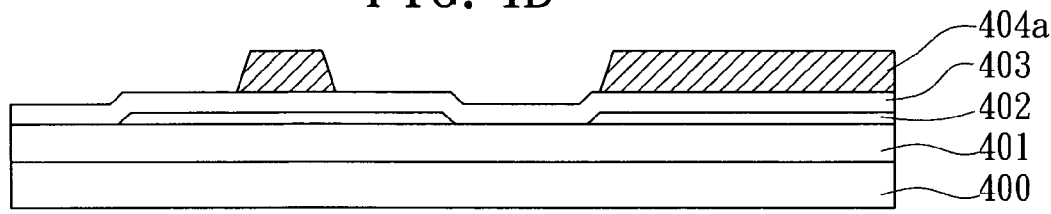
Figure 4D:
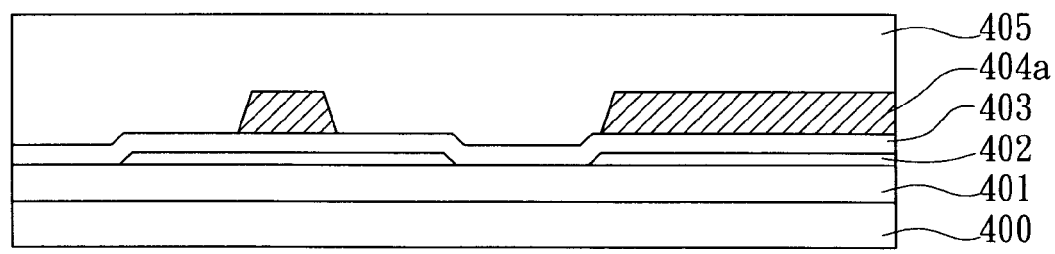
Figure 4E:
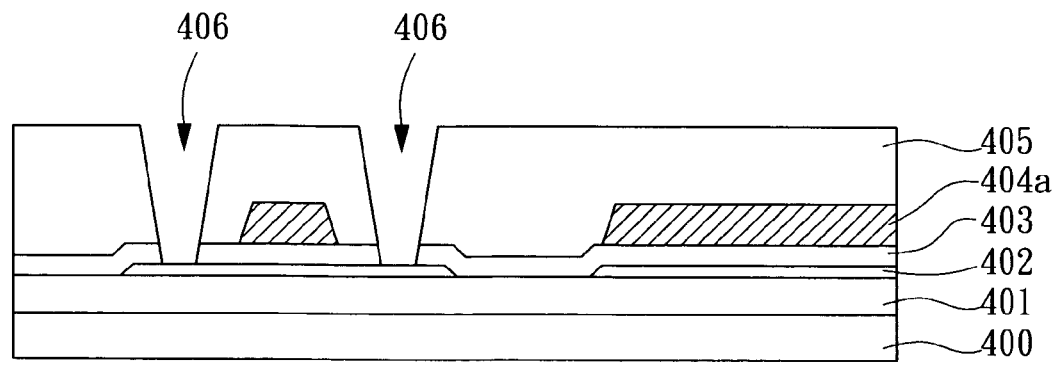
Figure 4F:
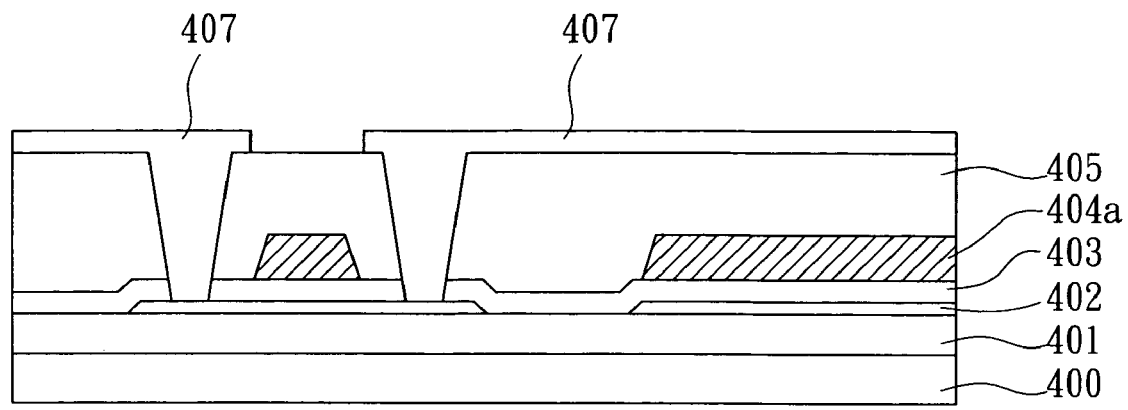

In FIG. 4F, a reflective pixel electrode layer is formed and patterned to define a reflective pixel electrode 407.

Figure 4G:
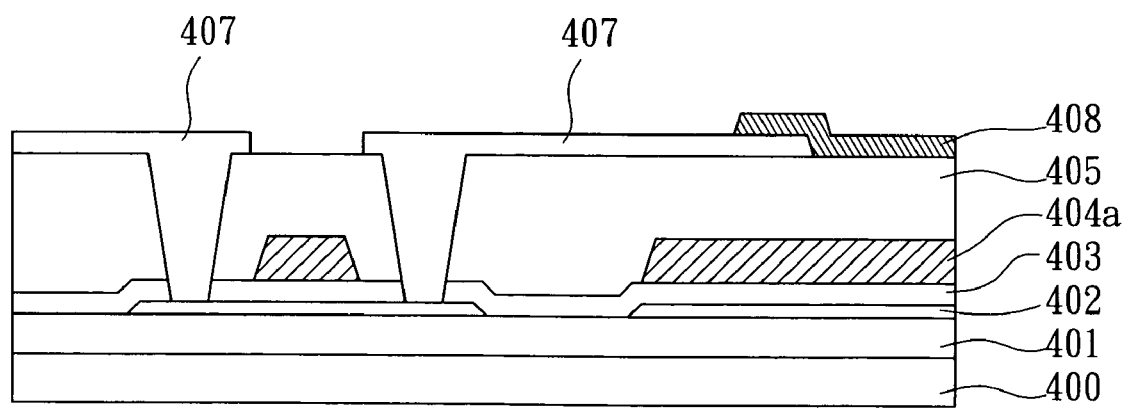

In FIG. 4G, a transparent electrode layer is formed and patterned to define a transmissive pixel electrode 408.

From the preferred embodiment shown in FIG. 4A to FIG. 4G, a total of 5 masks are used for the steps of: defining the polysilicon-island 402, patterning the first metal layer 404, forming the plurality of contact holes 406, defining the reflective pixel electrode 407 and patterning the transmissive pixel electrode 408.

Figure 5A:
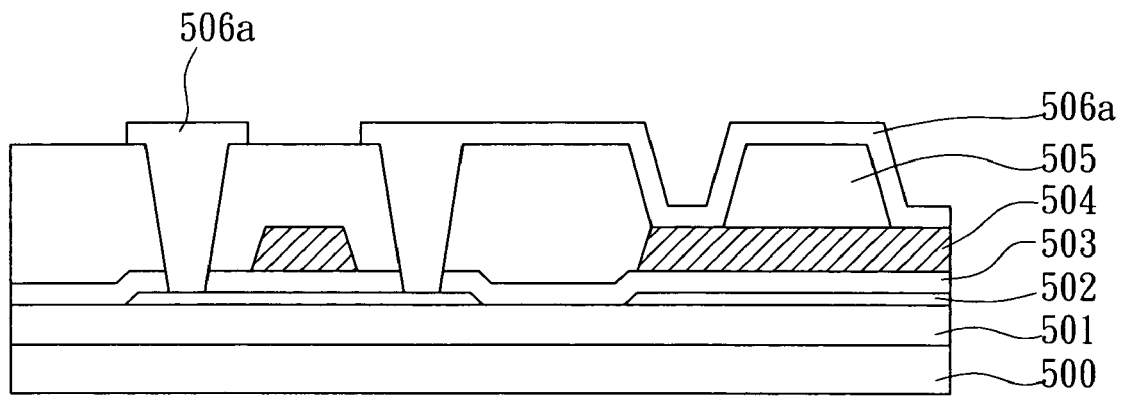
FIG. 5A is an illustration depicting a reflective thin film transistor fabricated by the method of using a photosensitive low-dielectric constant materials to reduce the number of masking steps used for low-temperature polysilicon thin film transistors according to another preferred embodiment of the present invention.
Figure 5B:
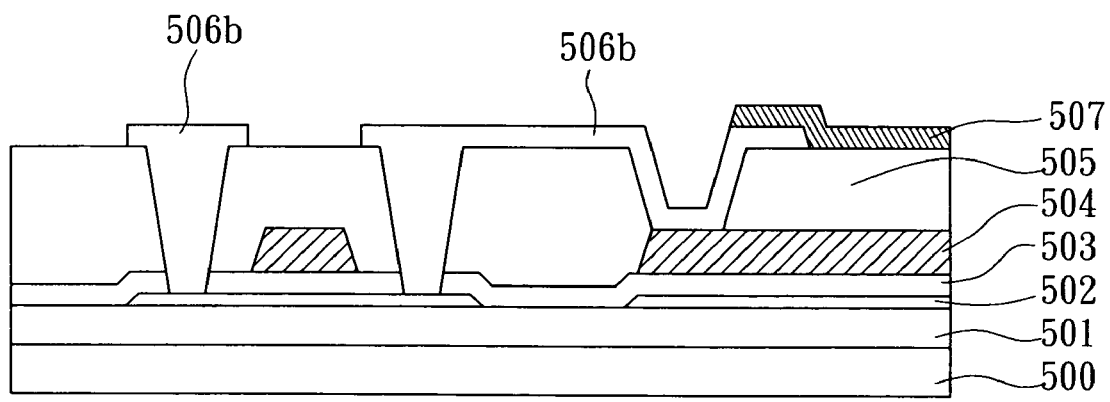
FIG. 5B is an illustration depicting a transflective thin film transistor fabricated by the method of mask reduction for producing a low-temperature polysilicon thin film transistor array by use of a photo-sensitive low-K dielectric according to another preferred embodiment of the present invention.

Please refer to FIG. 5A and FIG. 5B, which respectively are illustrations depicting a reflective thin film transistor and a transflective thin film transistor both fabricated by the method of mask reduction for producing a low-temperature polysilicon thin film transistor array by use of photo-sensitive low-K dielectric according to a preferred embodiment of the present invention. The position, procedure, and the materials used for forming a glass substrate 500, a buffer layer 501, a polysilicon-island 502, a gate oxide layer 503, a gate 504, and a photosensitive dielectric layer 505 for both embodiments shown in FIGS. 5A and 5B are similar to those in the foregoing embodiments, and, as a result, the same numerals and nomenclature are used, and thus will not be described further hereinafter. The major difference of these two preferred embodiments from other preferred embodiments resides on the different structures formed by the reflective pixel electrode 506a as shown in FIG. 5A and the transmissive pixel electrode 506b as shown in FIG. 5B, which produces a structure having a bump for these two preferred embodiments, and the semi-penetrative semi-reflective thin film transistor forms a transmissive pixel electrode 507.

In summation of the description above, the present invention utilizes the method of mask reduction for producing a low-temperature polysilicon thin film transistor array by use of a photo-sensitive low-K dielectric for surely reducing the number of masks required and, also, simplifying the level of complexity of the fabrication process. In addition, there will be no height difference produced when the contact holes are etched during the fabrication process. However, the aforementioned are just several preferable embodiments according to the present invention and, of course, can not be used to limit the scope of the present invention, so any equivalent variation and modification made according to the claims in the present invention are all still covered by the present invention.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of mask reduction for producing a low-temperature polysilicon thin film transistor array by use of a photo-sensitive low-K dielectric, comprising the steps of:
   (a) defining a polysilicon-island on a preprocessed glass substrate;
   (b) forming a gate oxide layer and a first metal layer in sequence;
   (c) patterning said first metal layer to define a gate;
   (d) forming a photosensitive low-K dielectric layer;
   (e) patterning said photosensitive low-K dielectric layer using photolithography so that a lithographic pattern is transferred onto said photosensitive low-K dielectric layer;
   (f) using said photosensitive low-K dielectric layer as an etch mask to carry out etching on said gate oxide layer to form a plurality of contact holes on said gate oxide layer;
   (g) forming a second metal layer and patterning the same; and
   (h) forming a transmissive pixel electrode layer and patterning the same to define a pixel electrode,
   wherein the photosensitive low-K dielectric layer formed functions as both a passivation layer and an interlayer dielectric.

2. The method as claimed in claim 1, wherein said preprocessed glass substrate is formed by a process comprising the steps of: depositing a buffer layer and forming an active layer by a high-temperature process in sequence.

3. The method as claimed in claim 2, wherein said buffer layer is substantially an oxide layer made of a tetraethoxysilane (TEOS) material.

4. The method as claimed in claim 2, wherein said active layer is substantially a layer of α-Silicon.

5. The method as claimed in claim 1, wherein said first metal layer comprises a material selected from the group consisting of tungsten-molybdenum alloy (MoW), chromium (Cr), aluminum (Al), aluminum/neodymium (Al/Nd), molybdenum (Mo), titanium (Ti), tantalum (Ta) and copper (Cu).

6. The method as claimed in claim 1, wherein said second metal layer comprises a material selected from the group consisting of tungsten-molybdenum alloy (MoW), chromium (Cr), aluminum (Al), aluminum/neodymium (Al/Nd), molybdenum (Mo), titanium (Ti), tantalum (Ta) and copper (Cu).

7. A method of mask reduction for producing a low-temperature polysilicon thin film transistor array by use of a photo-sensitive low-K dielectric, comprising the steps of:
   (a) defining a polysilicon-island on a preprocessed glass substrate;

(b) forming a gate oxide layer and a first metal layer in sequence;
(c) patterning said first metal layer to define a gate;
(d) forming a photosensitive low-K dielectric layer;
(e) patterning said photosensitive low-K dielectric layer using photolithography so that a lithographic pattern is transferred onto said photosensitive low-K dielectric layer;
(f) using said photosensitive low-K dielectric layer as an etch mask to carry out etching on said gate oxide layer to form a plurality of contact holes on said gate oxide layer;
(g) forming a reflective pixel electrode layer; and
(h) patterning said reflective pixel electrode layer to define a reflective pixel electrode,
wherein the photosensitive low-K dielectric layer formed functions as both a passivation layer and an interlayer dielectric.

8. The method as claimed in claim 7, wherein said preprocessed glass substrate is formed by a process comprising the steps of: depositing a buffer layer and forming an active layer by a high-temperature process in sequence.

9. The method as claimed in claim 8, said buffer layer is substantially an oxide layer made of a tetraethoxysilane (TEOS) material.

10. The method as claimed in claim 8, wherein said active layer is substantially a layer of $\alpha$-Silicon.

11. The method as claimed in claim 7, wherein said first metal layer comprises a material selected from the group consisting of tungsten-molybdenum alloy (MoW), chromium (Cr), aluminum (Al), aluminum/neodymium (Al/Nd), molybdenum (Mo), titanium (Ti), tantalum (Ta) and copper (Cu).

12. A method of mask reduction for producing a low-temperature polysilicon thin film transistor array by use of a photo-sensitive low-K dielectric, comprising the steps of:
    (a) defining a polysilicon-island on a preprocessed glass substrate;
    (b) forming a gate oxide layer and a first metal layer in sequence;
    (c) patterning said first metal layer to define a gate;
    (d) forming a photosensitive low-K dielectric layer;
    (e) patterning said photosensitive low-K dielectric layer using photolithography so that a lithographic pattern is transferred onto said photosensitive low-K dielectric layer;
    (f) using said photosensitive low-K dielectric layer as an etch mask to carry out etching on said gate oxide layer to form a plurality of contact holes on said gate oxide layer;
    (g) forming a reflective pixel electrode layer and patterning the same; and
    (h) forming a transmissive pixel electrode layer and patterning the same,
    wherein the photosensitive low-K dielectric layer formed functions as both a passivation layer and an interlayer dielectric.

13. The method as claimed in claim 12, wherein said preprocessed glass substrate is formed by a process comprising the steps of:
    depositing a buffer layer and forming an active layer by a high-temperature process in sequence.

14. The method as claimed in claim 13, said buffer layer is substantially an oxide layer made of a tetraethoxysilane (TEOS) material.

15. The method as claimed in claim 13, wherein said active layer is substantially a layer of $\alpha$-Silicon.

16. The method as claimed in claim 12, wherein said first metal layer comprises a material selected from the group consisting of tungsten-molybdenum alloy (MoW), chromium (Cr), aluminum (Al), aluminum/neodymium (Al/Nd), molybdenum (Mo), titanium (Ti), tantalum (Ta) and copper (Cu).

* * * * *